United States Patent

[11] 3,599,202

[72] Inventor William J. De Vey
Beaverton, Oreg.

[21] Appl No. 792,691
[22] Filed Jan. 21, 1969
[45] Patented Aug. 10, 1971
[73] Assignee Tektronix, Inc.
Beaverton, Oreg.

[54] ANALOG-TO-DIGITAL CONVERTER
6 Claims, 1 Drawing Fig.

[52] U.S. Cl. .................... 340/347 AD, 307/315
[51] Int. Cl. .................... G08c 9/00, H03k 13/17
[50] Field of Search .................... 340/347 AD; 307/315

[56] References Cited

UNITED STATES PATENTS

Re. 26,274 10/1967 Doyle .................... 340/347
3,436,752 4/1969 Pihl .................... 340/347

*Primary Examiner*—Thomas A. Robinson
*Attorney*—Buckhorn, Blore, Klarquist and Sparkman

ABSTRACT: An analog-to-digital converter comprises a plurality of amplifiers each employing a Darlington pair of transistors. The input to each amplifier is supplied from a voltage divider, and all the voltage dividers are connected to a common input terminal from which a current is drawn indicative of an analog input value. The voltage dividers are proportioned for turning off each amplifier at a different current value as the current drawn from the input terminal increases. Also, diode coupling means are disposed between the output terminal of each amplifier and the voltage divider associated with each subsequent amplifier, causing each subsequent amplifier to remain in a nonconducting state until the previous amplifier is turned off. As the input current increases, only one transistor amplifier conducts at a time.

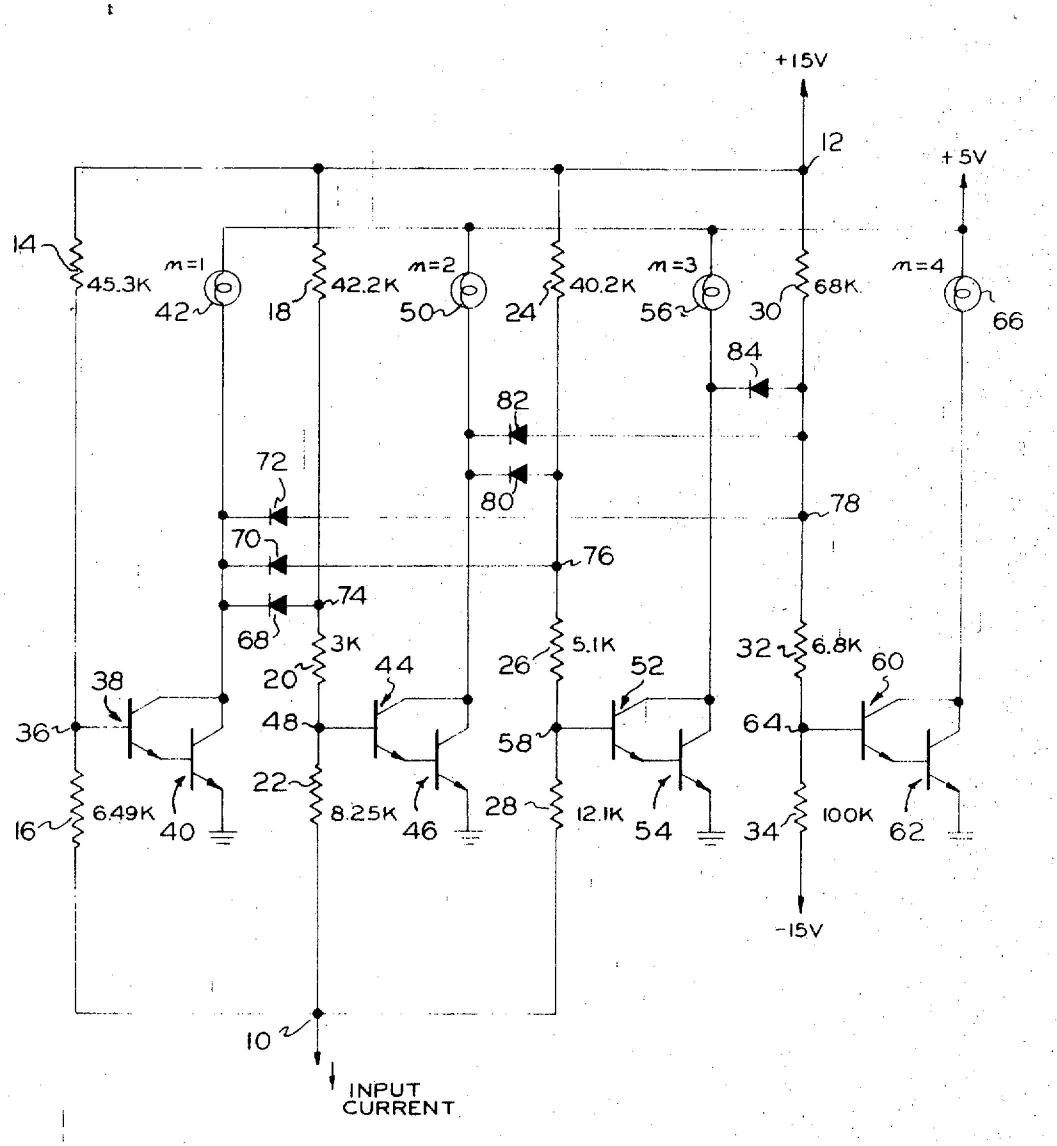
WILLIAM J. DE VEY
*INVENTOR*
*BY*
*BUCKHORN, BLORE, KLARQUIST & SPARKMAN*
*ATTORNEYS*

ANALOG-TO-DIGITAL CONVERTER

BACKGROUND OF THE INVENTION

One type of analog-to-digital converter performs a number of comparisons between graded standard values and an analog input value. Usually the comparison circuitry is fairly sensitive and does not directly drive output means or indication means, but rather additional buffering circuitry is employed. The resultant converter may be complex, especially if the conversion involves many comparisons. Alternatively, a feedback system can be utilized wherein the output of a comparator controls the operation of a digital-to-analog converter, and wherein the latter provides a second input to the comparator. When compared values are equal, the circuit delivers the desired digital output. However, this type of circuitry is also apt to be complex.

SUMMARY OF THE INVENTION

According to the present invention, a simplified analog-to-digital converter of moderate resolution comprises a number of amplifier stages, each receiving an input via a biasing network or voltage divider, wherein all such biasing networks or voltage dividers are connected to a common input terminal from which an analog input current is drawn. The component values of the voltage dividers are chosen such that each amplifier would be successively biased to cut off as greater current is withdrawn from the input terminal. Each transistor amplifier drives an output means such as an indicating lamp. Each transistor amplifier also drives a plurality of means, preferably diodes, coupling the output of each amplifier to the voltage dividers associated with amplifiers driving output means indicative of higher order number outputs. When a given amplifier conducts, it causes current flow not only through its own load device, but through the voltage dividers of subsequent amplifiers, whereby the subsequent amplifiers are cut off. As the input current is increased, such that a given amplifier is driven into cutoff at its own voltage divider, a portion of the output current thereof will no longer be drawn through subsequent voltage dividers, and the next subsequent amplifier in order will be allowed to conduct.

The transistor amplifiers are preferably Darlington pairs. This connection provides high current gain so that an output means such as a lamp bulb may be operated despite relatively high driving impedance. Furthermore, each Darlington pair and the diode driven thereby produces the same two-diode drop as the next Darlington pair. As a result, the circuit is temperature compensated and the coupling diodes properly track the input of the next amplifier at various operating temperatures. According to the present invention, a number of output devices are directly driven by a compact and uncomplicated converter circuit.

It is accordingly an object of the present invention to provide an improved analog-to-digital converter which is capable of providing appreciable output without substantial circuitry complexity.

It is a further object of the present invention to provide an improved moderate resolution analog-to-digital converter which is compact and economical to manufacture.

It is another object of the present invention to provide an improved moderate resolution analog-to-digital converter which is compensated to operate over a wide temperature range.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawing wherein like reference characters refer to like elements.

DRAWING

The single FIGURE is a schematic diagram of an analog-to-digital converter according to the present invention.

DETAILED DESCRIPTION

Referring to the drawing, the analog-to-digital converter according to the present invention includes a common input terminal 10 from which an analog input current is drawn. A plurality of biasing networks or voltage dividers are disposed between a +15 volt terminal 12 and the input terminal 10. A first such voltage divider comprises resistors 14 and 16 connected in series in that order between terminals 12 and 10. A second voltage divider similarly includes resistors 18, 20 and 22, while a third voltage divider comprises resistors 24, 26 and 28. A fourth voltage divider is interposed between terminal 12 and a −15 volt source, and comprises resistors 30, 32 and 34 arranged in that order. Appropriate values for the individual resistors comprising the various voltage dividers are shown on the drawing. These values are intended only to be exemplary of appropriate values which may be selected.

Tap 36 between resistors 14 and 16 is connected to the input of a first amplifying means here comprising a Darlington pair of NPN transistors 38 and 40. The collector terminals of the transistors are connected together to provide an output terminal for the amplifying means while the emitter of transistor 40 forms a common terminal for the amplifying means and is returned to ground. The emitter of transistor 38 is directly connected to the base of transistor 40. The output terminal for the amplifying means is connected to a load comprising a lamp bulb 42, the opposite terminal of which is connected to +5 volts.

A second amplifying means comprises transistors 44 and 46 forming a Darlington pair interconnected in the same manner as transistors 38 and 40. The input terminal of the amplifier 44, 46 is connected to tap 48 between resistors 20 and 22, while the output terminal or common collector connection of the amplifier 44, 46 is coupled to lamp bulb 50, the remaining terminal of which is returned to +5 volts. Similarly, a pair of transistors 52 and 54 provides an output at the common collector connection thereof and is coupled through lamp bulb 56 to +5 volts. The base of transistor 52 is directly connected to tap 58 between resistors 26 and 28.

A final pair of transistors 60 and 62 constitute an amplifier of the same type hereinbefore described wherein the base input terminal of transistor 60 is connected to tap 64 and the common collector connection is coupled to +5 volts by way of lamp bulb 66. The emitter of transistor 62 is grounded.

The output terminal of the amplifier 38, 40 is coupled to second taps on the voltage dividers associated with subsequent amplifiers, i.e. the second, third and fourth amplifiers, by means of diodes 68, 70 and 72. The cathode of each said diode is connected to the output terminal of amplifier 38, 40. The anode of diode 68 connects to tap 74 located between resistors 18 and 20 while the anode of diode 70 is connected to tap 76 between resistors 24 and 26. Similarly, the anode of diode 72 is connected to tap 78 disposed between resistors 30 and 32.

The output terminal or common collector connection of transistors 44 and 46 is coupled to the voltage dividers of subsequent stages by means of diodes 80 and 82, wherein the cathodes of diodes 80 and 82 are connected to the output terminal of amplifier 44, 46. The anode of diode 80 is connected to tap 76 while the anode of diode 82 is connected to tap 78.

The output terminal of amplifier 52, 54 is also coupled to the voltage divider associated with the input of the next stage by means of diode 84, the cathode of which is connected in common to the collectors of transistors 52 and 54. The anode of diode 84 is directly connected to tap 78.

As will be noted from the drawing, resistors 16, 22 and 28 connected to input terminal 10 have successively higher resistances. Then, as current is drawn from terminal 10, the normally conducting amplifier 38, 40 will be the first to shut off as an appropriate voltage drop takes place across resistor 14. Ignoring the diodes interconnecting each amplifier with the voltage dividers associated with succeeding amplifiers, it will be seen that the amplifiers would turn off in order. Thus, as the input current is further increased, amplifier 44, 46 will next shut off, followed by amplifier 52, 54 as the input current increases.

However, as long as amplifier 38, 40 conducts, it draws current through diodes 68, 70 and 72, and through resistors 18, 24 and 30 forming part of the voltage dividers associated with succeeding stages. This current from amplifier 38, 40 produces a sufficient voltage drop across resistors 18, 24 and 30 for maintaining subsequent amplifiers in a cutoff condition. When amplifier 38, 40 ceases conduction, current is no longer drawn through diodes 68, 70 and 72, and the amplifier 44, 46 is allowed to conduct. As amplifier 38, 40 shuts off and no longer draws the current through resistor 18 and diode 68, amplifier 44, 46 goes into conduction, until such time as the current drawn through terminal 10 from the voltage divider 18, 20, 22 cuts off the amplifier 44, 46 by producing an appropriate voltage drop across resistors 18 and 20. Thus, the lower current limit for each stage is set by the preceding stage's turning off. The upper limit for the operation of each stage is set by that stage shutting off.

The digital output indication is provided in the specific embodiment by lamp bulbs 42, 50, 56 and 66. Each successive lamp bulb, when lit, represents a successively higher or larger digital output in the order given. Thus, for a first value of current drawn from terminal 10, amplifier 38, 40 energizes lamp bulb 42 to provide an $n=1$ indication. As the current is further increased so that stage 38, 40 turns off and stage 44, 46 is energized, lamp bulb 50 will provide an $n=2$ indication, and so on. When the current from terminal 10 reaches a high enough voltage to turn off amplifier 52, 54, then stage 60, 62 will light the lamp bulb 66. This lamp bulb will stay on providing an $n=4$ output for the maximum value of current. Since $n=4$ represents the highest analog input current, stage 60, 62 need not be cut off and the resistor 34 is not returned to input terminal 10. However, it may be so connected if so desired, with the resistance values changed appropriately.

Also, a four stage circuit for digital outputs from $n=1$ to $n=4$ is given by way of example only. A larger number of stages and output means may be employed, depending upon design variables such as supply voltages, component tolerances, and the like. Six or more stages are easily possible.

The diodes connected to an output terminal of a particular amplifier stage are connected to the voltage divider of succeeding stages in predetermined order, at a tap on those voltage dividers above the tap to which the input terminal of the succeeding stage is connected. Thus, diode 68 is connected at tap 74 above tap 48 with an intervening resistor 20 interposed therebetween. Diodes 68, 70 and 72 must be forward biased if they are to conduct when amplifier 38, 40 is on, for drawing current through resistors 18, 24 and 30. Thus, the voltage at tap 74, for example, must be high enough when the amplifier 38, 40 conducts so that diode 68 will be forward biased. At the same time, the voltage at tap 48, for example, must be low enough so that amplifier 44, 46 will be biased below cutoff. Therefore, the anode of diode 68 and the base of transistor 44 cannot be connected to the same point, but the voltage drop across resistor 20 must be provided therebetween.

Furthermore, resistors 20, 26 and 32 have successively higher values. Therefore, as stage 38, 40 turns off, the amplifier stage 44, 46 will be the next to turn on, rather than amplifier stage 52, 54, for example. Thus, as amplifier stage 38, 40 starts to draw less current so that the voltage at its output terminal rises, diode 68 will be the first to be back biased allowing stage 44, 46 to turn on. Diodes 70 and 72, connected to higher voltage points on their respective voltage dividers, will maintain stages 52, 54 and 60, 62 in an off condition until the amplifier stage 44, 46 can provide current through diodes 80 and 82 continuing the higher order stages in an off condition.

Of course, the action of the digital-to-analog converter is reversible. That is, as the current is decreased, for example from a condition wherein stage 60, 62 lights the lamp bulb 66, then stages 52, 54 will be the next to turn on, and so on.

The respective amplifying means advantageously comprise Darlington pairs of transistors which provide high current gain so that an output means such as a lamp bulb may be operated by each amplifier means despite relatively high driving impedance. Also, each Darlington pair and the diode driven thereby produces the same two-diode drop as the next Darlington pair. Thus, referring to transistors 38 and 40, transistor 38 is saturated during operation, but transistor 40 is not. The collector and emitter of transistor 38 are at substantially the same potential since transistor 38 is saturated. This means that the base and collector of transistor 40 are at substantially the same potential. Therefore, the pair produces a one-diode drop, i.e. across the base-emitter junction of transistor 40. Diode 68 produces a second diode drop and is coupled to the base of transistor 44. The temperature coefficients of both the diode 68 and the base-emitter junction of transistor 40 are in the same direction, and therefore the voltage at tap 74 should track the base of transistor 44 at various temperatures, with a two-diode drop also taking place across the base-emitter junctions of transistors 44 and 46 to ground. As a result, the circuit is temperature compensated, and the coupling diodes properly track the input of the next amplifying means at various operating temperatures.

While I have shown and described a preferred embodiment of my invention, it will be apparent to those skilled in the art that many changes and modifications may be made without departing from my invention in its broader aspects.

I claim:

1. An analog-to-digital converter comprising:

a plurality of transistor amplifiers each having an input terminal, an output terminal, and a common terminal, a circuit input terminal, a plurality of voltage dividers connected between a voltage source and said circuit input terminal, each voltage divider comprising series connected resistances, wherein a first tap of each voltage divider is connected to an input terminal of one of said transistor amplifiers, the component values of said voltage dividers being different in each voltage divider for presenting a voltage at said first tap adapted to produce a change in state of respective transistor amplifiers for different values of current passing said circuit input terminal, each transistor amplifier being biased thereby for normal conduction until current drawn from said input terminal causes the transistor amplifier to be biased to cutoff, a plurality of load means driven respectively by output terminals of the transistor amplifiers, and diode means interposed between an output terminal of each prior transistor amplifier in the successive order of reaching cutoff bias and second taps on voltage dividers which are coupled to input terminals of subsequent transistor amplifiers in said successive order, for maintaining such subsequent amplifiers in a nonconductive state until a transition takes place in said prior transistor amplifier thereby disconnecting the diode means as coupled to said subsequent transistor amplifiers for thereby allowing the next subsequent stage to conduct until the current drawn from the input terminal biases the next subsequent stage to cutoff.

2. The converter according to claim 1 wherein each transistor amplifier comprises a Darlington pair of transistors having their collector terminals connected together to provide an output terminal, having the emitter of a first such transistor connected to the base of a second such transistor, and wherein the emitter of the second transistor forms said common terminal and is returned to a point of common reference potential, the base of the first transistor providing an input terminal for said amplifier for connection to the associated voltage divider.

3. The converter according to claim 2 wherein each load means comprises an indicating lamp bulb connected to receive current through a respective amplifier.

4. The converter according to claim 1 wherein the second taps on the voltage dividers are located between said first taps and said voltage source, and wherein resistance separates the first and second taps.

5. The converter according to claim 4 wherein the resistance of the voltage divider between an amplifier input terminal and a diode means is higher for each successive amplifier.

6. The converter according to claim 4 wherein the resistance of the voltage divider between the amplifier input terminal and the circuit input terminal is higher for each successive amplifier.